(12) United States Patent
Fallourd

(10) Patent No.: US 11,923,234 B2
(45) Date of Patent: Mar. 5, 2024

(54) METHOD FOR SINGULATING CHIPS WITH LATERALLY INSULATED FLANKS

(71) Applicant: STMicroelectronics (Tours) SAS, Tours (FR)

(72) Inventor: Ludovic Fallourd, Louans (FR)

(73) Assignee: STMicroelectronics (Tours) SAS, Tours (FR)

( * ) Notice: Subject to any disclaimer, the term of this patent is extended or adjusted under 35 U.S.C. 154(b) by 44 days.

(21) Appl. No.: 16/950,787

(22) Filed: Nov. 17, 2020

(65) Prior Publication Data

US 2021/0151347 A1 May 20, 2021

(30) Foreign Application Priority Data

Nov. 19, 2019 (FR) ...................................... 1912895

(51) Int. Cl.
*H01L 21/768* (2006.01)
*H01L 21/02* (2006.01)
(Continued)

(52) U.S. Cl.
CPC .... *H01L 21/76224* (2013.01); *H01L 21/0228* (2013.01); *H01L 21/56* (2013.01)

(58) Field of Classification Search
CPC ........... H01L 21/76224; H01L 21/0228; H01L 21/56; H01L 24/03; H01L 27/0255; H01L 29/861; H01L 21/561; H01L 21/6835; H01L 24/92; H01L 23/3114; H01L 24/94; H01L 21/78; H01L 24/05; H01L 29/8611; H01L 24/06; H01L 24/95; H01L 2221/68377; H01L 2224/05647; H01L 2224/94; H01L 2224/95; H01L 2224/0384; H01L 24/32; H01L 2224/05567; H01L 2224/0603; H01L 2224/92242; H01L 2224/92; H01L 2224/05624; H01L 2224/06181; H01L 2224/32225; H01L 2224/2919; H01L 24/29; H01L 2924/00014; H01L 2224/83; H01L 2224/03; H01L 2924/00012
See application file for complete search history.

(56) References Cited

U.S. PATENT DOCUMENTS 4,982,079 A * 1/1991 Yagyu .................. H04N 1/0316
257/E27.141
9,627,228 B1 * 4/2017 Chen ....................... H01L 24/20
(Continued)

FOREIGN PATENT DOCUMENTS

EP   3 125 281 A1   2/2017
EP   3 211 670 A1   8/2017
(Continued)

*Primary Examiner* — Marcos D. Pizarro
*Assistant Examiner* — Tenley H Schofield
(74) *Attorney, Agent, or Firm* — Seed IP Law Group LLP

(57) ABSTRACT

The present disclosure relates to a method for manufacturing electronic chips. The method includes forming a plurality of trenches on a first face of a semiconductor substrate, in and on which a plurality of integrated circuits has been formed. The trenches delimit laterally a plurality of chips, and each of the chips includes a single integrated circuit. The method further includes electrically isolating flanks of each of the chips by forming an electrically isolating layer on lateral walls of the trenches.

26 Claims, 3 Drawing Sheets

(51) Int. Cl.
*H01L 21/56* (2006.01)
*H01L 21/762* (2006.01)
*H01L 23/00* (2006.01)
*H01L 23/31* (2006.01)
*H01L 23/367* (2006.01)
*H01L 23/495* (2006.01)
*H01L 23/522* (2006.01)
*H01L 23/528* (2006.01)
*H01L 23/532* (2006.01)
*H01L 25/065* (2023.01)

(56) References Cited

U.S. PATENT DOCUMENTS

| | | | | |
|---|---|---|---|---|
| 9,679,785 | B2* | 6/2017 | Chinnusamy | H01L 21/568 |
| 10,903,121 | B1* | 1/2021 | Park | H01L 21/3065 |
| 2006/0063351 | A1* | 3/2006 | Jain | G02F 1/1368 |
| | | | | 438/455 |
| 2006/0083948 | A1* | 4/2006 | Kawaguchi | H05K 9/0083 |
| | | | | 204/192.15 |
| 2008/0124896 | A1* | 5/2008 | Codding | H01L 21/78 |
| | | | | 438/459 |
| 2016/0042998 | A1* | 2/2016 | Pueschner | H01L 23/3114 |
| | | | | 438/114 |
| 2017/0047293 | A1* | 2/2017 | Moon | H01L 23/49838 |
| 2017/0229346 | A1* | 8/2017 | Chang | H01L 24/03 |
| 2018/0062027 | A1* | 3/2018 | Perzlmaier | H01L 33/30 |
| 2018/0211924 | A1* | 7/2018 | Andry | H01L 23/3192 |
| 2018/0342464 | A1* | 11/2018 | Andry | H01L 24/05 |
| 2019/0088613 | A1* | 3/2019 | Wright | H01L 24/29 |

FOREIGN PATENT DOCUMENTS

| | | |
|---|---|---|
| WO | 2018/100273 A1 | 7/2018 |
| WO | 2018/200211 A1 | 11/2018 |

* cited by examiner

METHOD FOR SINGULATING CHIPS WITH LATERALLY INSULATED FLANKS

BACKGROUND

Technical Field

The present disclosure relates to a method for manufacturing electronic chips. It is more specifically directed to a method for manufacturing electronic chips the flanks of which are protected by a layer of an electrically isolating material.

Description of the Related Art

An electronic chip traditionally comprises an integrated circuit formed in and on a semiconductor substrate. For numerous applications, it is desirable to have electronic chips in which the flanks of the substrate are covered by a layer of an electrically isolating material. This allows the protection of the substrate against possible rises of soldering material on its flanks during the mounting of the chip in an external device.

The known methods for manufacturing chips with isolated flanks have various drawbacks.

BRIEF SUMMARY

It would desirable to improve at least partly certain aspects of the known methods for manufacturing electronic chips.

An embodiment provides a method for manufacturing electronic chips comprising the following steps:
a. forming, on the side of a first face of a semiconductor substrate, in and on which a plurality of integrated circuits has been formed beforehand, trenches delimiting laterally a plurality of chips each comprising a single integrated circuit; and
b. depositing an electrically isolating layer on the lateral walls of the trenches by an ALD deposition method, so as to isolate the flanks of each chip.

According to an embodiment, during steps a) and b), the chips are kept fixed by a support film on the side of the semiconductor substrate opposite its first face.

According to an embodiment, the trenches formed in step a) exit at the support film.

According to an embodiment, the electrically isolating layer deposited in step b) further extends, on each chip, on the side of the first face of the semiconductor substrate.

According to an embodiment, each chip comprises at least one metal connection pad on the side of the semiconductor substrate opposite its first face.

According to an embodiment, in step a), the trenches are formed by sawing. In some embodiments, the trenches may be formed by etching or ablation, for example, by plasma etching or laser ablation.

According to an embodiment, step b) is preceded by a step of depositing a layer of protective resin on the first face of the substrate.

According to an embodiment, step a) is preceded by a step of thinning the semiconductor substrate via its first face.

According to an embodiment, said electrically isolating layer comprises at least one oxide layer.

According to an embodiment, said electrically isolating layer comprises at least one layer made of a material from the group comprising alumina, silicon dioxide and titanium dioxide.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the realization of the integrated circuits present in the electronic chips has not been described in detail.

Unless indicated otherwise, when reference is made to two elements that are connected together, this means a direct connection without any intermediate elements other than conductors, and when reference is made to two elements that are coupled together, this means that these two elements can be connected or coupled by way of one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

FIGS. 1 to 8 are sectional views depicting successive steps of an example of a method for manufacturing electronic chips according to an embodiment.

Figure 1:
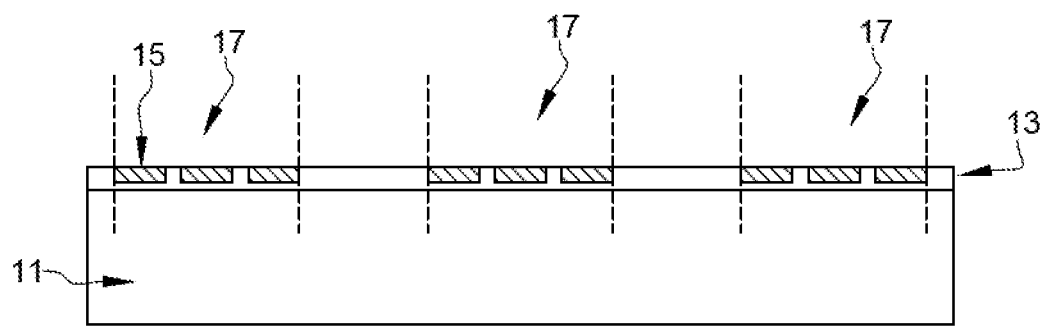
FIG. 1 depicts a step of a method for manufacturing electronic chips according to an embodiment.

FIG. 1 is a sectional view of an initial structure comprising a semiconductor substrate 11 in and on which integrated circuits 17 have been formed beforehand. The circuits 17 are, for example, all identical with the exception of the manufacturing dispersions. The substrate 11 can correspond to a wafer of a semiconductor material, for example, silicon. The substrate 11 has, for example, a thickness comprised between 300 and 900 μm, for example, a thickness of approximately 725 μm.

The structure shown in FIG. 1 further comprises a stack of conductive and isolating layers 13 covering the upper face of the substrate 11, called interconnection stack, in which elements for interconnecting the components of each circuit 17 can be formed. The interconnection stack 13 further comprises, for each integrated circuit 17, one or more metal contact pads 15 flush with the upper face of the integrated circuit 17 and intended to be connected to an external device. In FIG. 1, three metal contact pads 15 have been illustrated, it being understood that, in practice, the number of metal contact pads 15 can be different than three.

Each integrated circuit 17 comprises, for example, one or more electronic components (transistors, diodes, thyristors, triacs, etc.).

In FIG. 1, three integrated circuits 17 have been illustrated, it being understood that, in practice, the number of integrated circuits 17 formed in and on the substrate 11 can be different than three.

Figure 2:
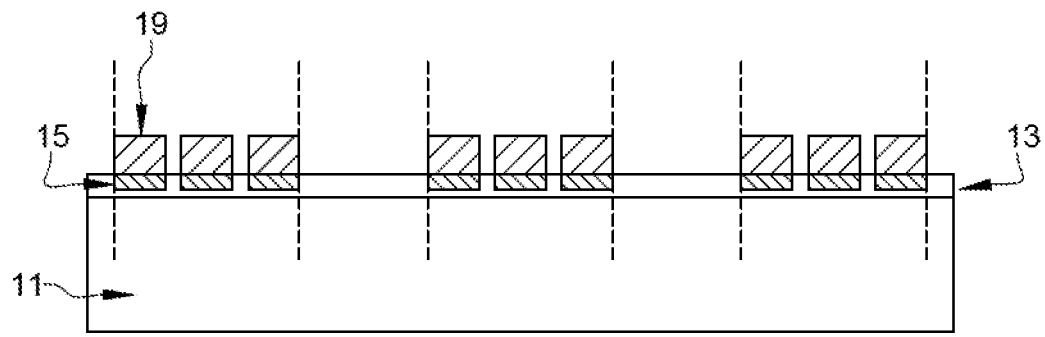
FIG. 2 depicts a further step of a method for manufacturing electronic chips according to an embodiment.

FIG. 2 is a sectional view depicting a step of forming metal connection pillars 19 on and in contact with the metal pads 15.

More specifically, in this example, a connection pillar 19 is formed on each pad 15. Each pillar 19 extends, for example, when viewed from above, over the entire surface of the underlying pad 15. Each pillar 19 has, for example, when viewed from above, a square or rectangular shape. As an alternative, the pillars can have other shapes, for example, a circular shape. The upper face of the pillars 19 is, for example, substantially flat. The pillars 19 can, for example, be formed by electrolytic growth. The pillars 19 can be made of a tin-based alloy, for example, an alloy based on tin and silver (SnAg), for example, an alloy tin-silver-copper.

In the following description, the lower face of the structure, in the orientation shown in FIG. 2, is considered to be the rear face, and the upper face of the structure, in the orientation shown in FIG. 2, is considered to be the front face.

Figure 3:
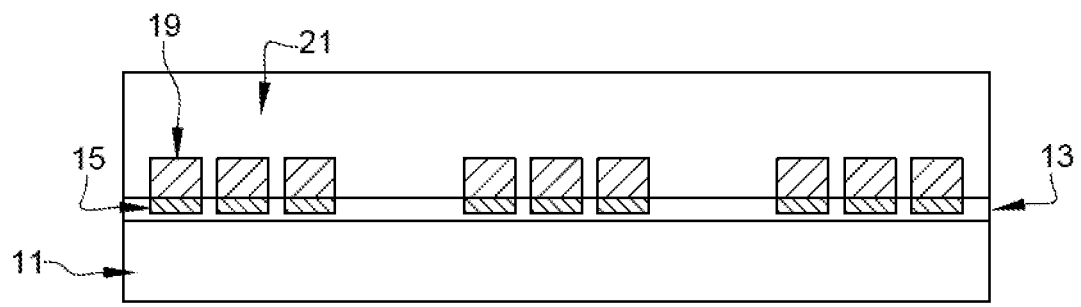
FIG. 3 depicts a further step of a method for manufacturing electronic chips according to an embodiment.

FIG. 3 depicts a step of thinning, via its rear face, the structure obtained at the end of the step shown in FIG. 2. Prior to this thinning, the structure is fixed, by its front face, onto a support film 21, for example, an adhesive film. Thinning is then realized, for example, by mechanical grinding. Thinning is, in variants, realized by CMP (Chemical Mechanical Polishing).

In this example, the substrate 11 is thinned via its rear face until the lower face of the circuits 17 is reached. At the end of this step, the thickness of the substrate 11 may be within a range from about 50 μm to about 400 μm. In some embodiments, the thickness of the substrate 11 after the thinning is, for example, equal to approximately 200 μm.

Figure 4:
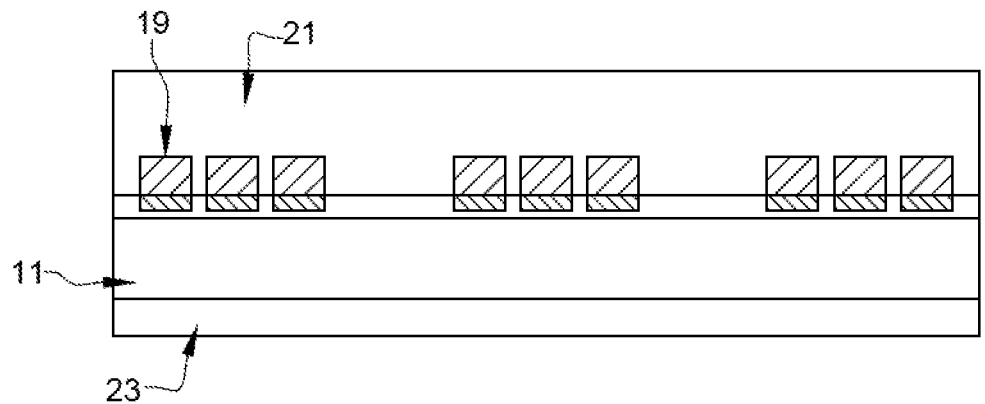
FIG. 4 depicts a further step of a method for manufacturing electronic chips according to an embodiment.

FIG. 4 is a sectional view, depicting a step of depositing a protective resin layer 23, on the rear face of the structure obtained at the end of the step shown in FIG. 3. The layer of resin 23 extends, for example, in a continuous manner and with a substantially constant thickness over the entire rear face of the substrate 11.

For instance, the resin 23 is an epoxy resin. In some embodiments, the resin layer 23 may have a thickness within a range from about 5 μm to about 50 μm. In some embodiments, the resin layer 23 has, for example, a thickness in the order of 25 μm. The resin layer 23 may be optional, and in some embodiments, the resin layer 23 may be omitted. The resin layer 23 may be utilized as a media for marking, as described in further detail below. In embodiments in which the resin layer 23 is omitted, marking may be achieved by other techniques, such as direct marking on the substrate 11, or by marking an epoxy or other layer that may be provided on the rear face of the substrate 11.

The resin 23 can be an opaque resin, for example, a black resin. By means of the resin 23, it is possible to give the rear face of the chips a visual appearance that certain manufacturers seek. The use of an opaque resin further allows to protect the substrate from ultraviolet radiation.

The step depicted in FIG. 4 can be followed by a step of marking the chips by etching, on each chip, a marking pattern, for example, an identification code or a logo, on the rear face of the layer of resin 23. The marking is, for example, realized by laser etching. Other techniques may be utilized for marking the chips, for example, in various embodiments ink jet marking or any suitable marking technique may be utilized. Moreover, in embodiments in which the resin 23 is omitted, marking may be accomplished directly on the substrate 11 or on another layer such as an epoxy layer that may be provided on the rear face of the substrate 11.

Figure 5:
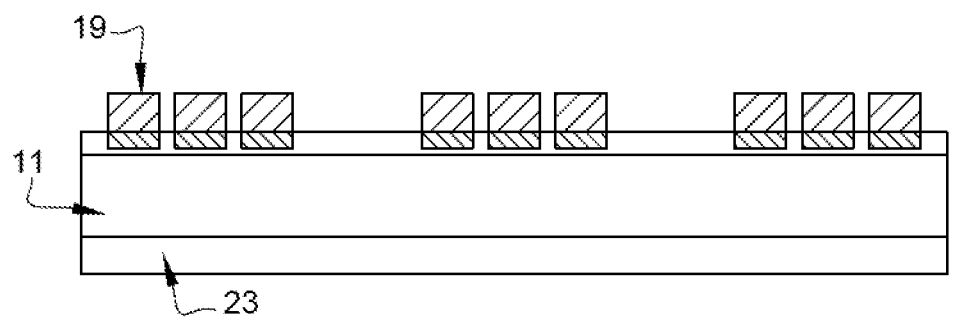
FIG. 5 depicts a further step of a method for manufacturing electronic chips according to an embodiment.

FIG. 5 depicts a step of removing the support film 21 on the front face of the structure.

Figure 6:
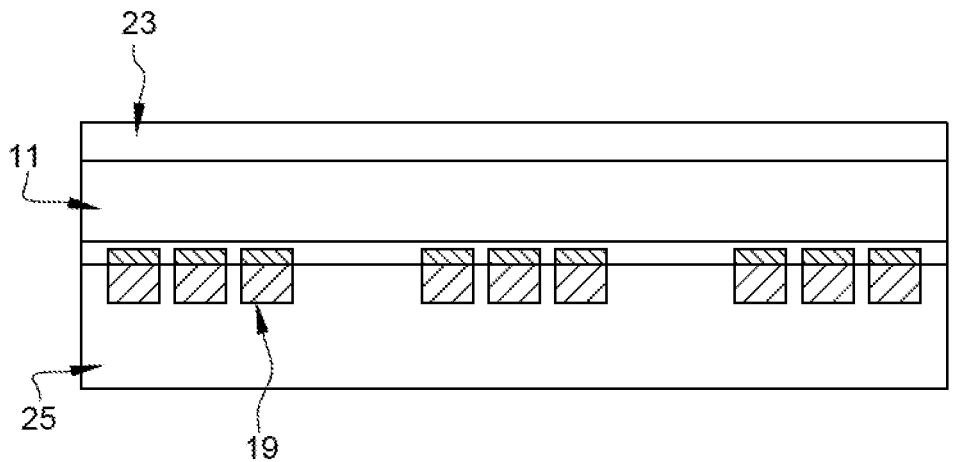
FIG. 6 depicts a further step of a method for manufacturing electronic chips according to an embodiment.

FIG. 6 depicts a step of fixing the structure, by its front face, onto a support film 25. It should be noted that, in the example shown in FIG. 6, the orientation of the structure is reversed with respect to the sectional views shown in the preceding figures.

Figure 7:
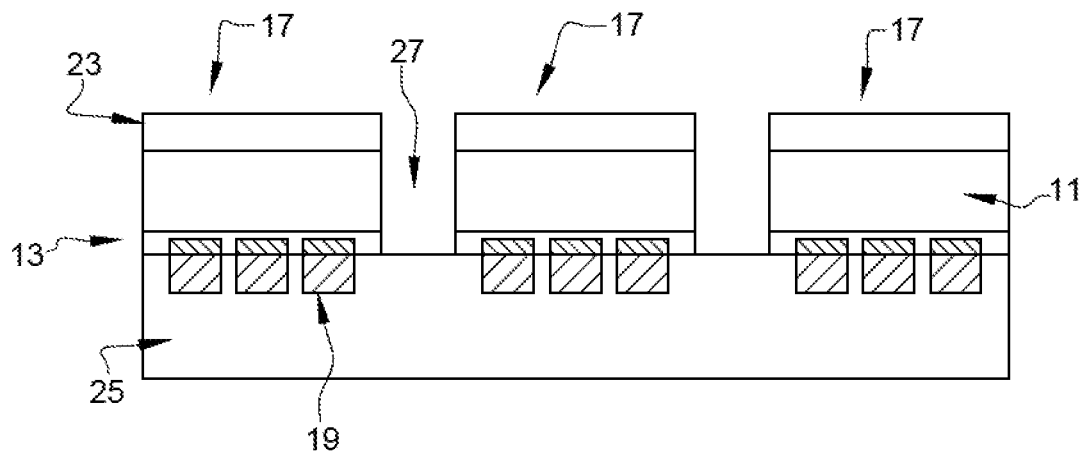
FIG. 7 depicts a further step of a method for manufacturing electronic chips according to an embodiment.

FIG. 7 is a sectional view in the same orientation as FIG. 6, depicting a step of cutting the structure into individual chips each comprising a single integrated circuit 17. During this step, trenches 27 are realized from the rear face of the structure. When viewed from above, the trenches 27 extend between the integrated circuits 17 so that each integrated circuit 17 is separated from its neighbor(s) by a trench 27. For instance, each integrated circuit 17 is entirely delimited, laterally, by trenches 27. In this example, the trenches 27 extend, vertically from the upper face of the layer of protective resin 23 to the upper face of the support film 25. In other words, in this example, the trenches 27 completely span the layer of resin 23, the substrate 11 and the interconnection stack 13. The trenches 27 are, for example, realized by sawing. During this step, the alignment of the cutting tool is realized based on the front face of the structure. For this purpose, a film 25 transparent to the irradiance wavelength(s) of the alignment tool will preferably be chosen.

At the end of this step, a plurality of individual chips joined solely by the support film 25 is obtained.

Figure 8:
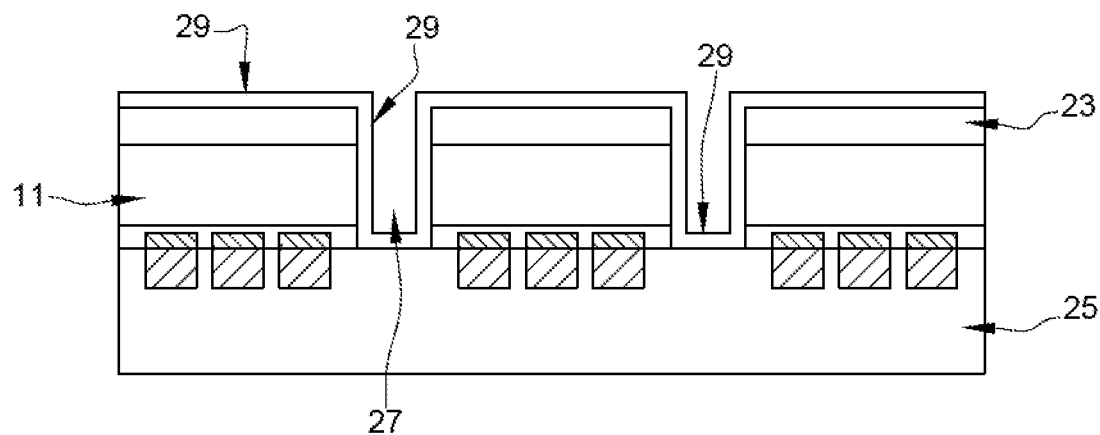
FIG. 8 depicts a further step of a method for manufacturing electronic chips according to an embodiment.

FIG. 8 is a sectional view, in the same orientation as FIG. 7, depicting a step of depositing an electrically isolating layer 29 on the rear face of the structure obtained at the end of the step shown in FIG. 7. In this example, the layer 29 is deposited in a continuous manner and with a substantially constant thickness over the entire rear surface of the structure, i.e., on the upper face of the layer 23, as well as on the lateral walls and the bottom of the trenches 27. In particular, in this example, the layer 29 is deposited on and in contact with the flanks of the substrate 11 of each chip.

The layer 29 is deposited by ALD (Atomic Layer Deposition). The deposition of the layer 29 can be realized at a low temperature, for example, at a temperature lower than 100° C., for example, in the order of 80° C. The layer 29 has, for example, a thickness comprised between 5 and 50 nm, and in some embodiments, between 20 and 40 nm. The thickness of the layer 29 may be selected as desired depending on design considerations, such as a desired amount of electrical isolation or insulation.

For instance, the layer 29 can be an oxide layer, for example, a layer of alumina ($Al_2O_3$), a layer of titanium dioxide ($TiO_2$), a layer of silicon dioxide ($SiO_2$), or any other material capable of being deposited by ALD. As an alternative, the layer 29 can comprise a stack of a plurality of layers of separate materials successively deposited by ALD.

The chips can then be removed from the support film 25 with a view to their mounting in an external device.

Figure 9:
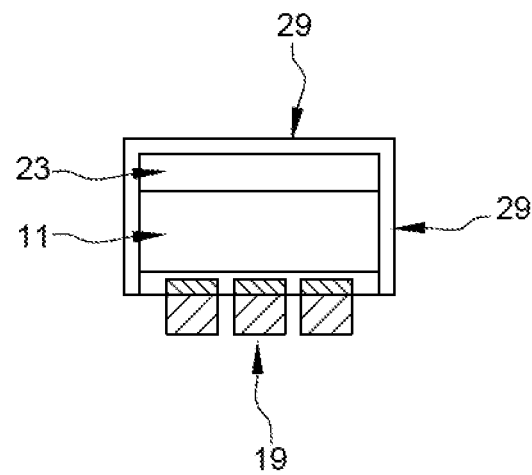
FIG. 9 depicts an example of an electronic chip realized by the method shown in FIGS. 1 to 8.

FIG. 9 is a sectional view, in the same orientation as FIG. 8, depicting an example electronic chip obtained by the manufacturing method shown in FIGS. 1 to 8, after removal from the support film 25.

An advantage of the method described above is that it is particularly simple to implement and that it allows, by using the ALD method of deposition, to obtain a lateral electrical isolation that is thin and effective.

Various embodiments and alternatives have been described. Those skilled in the art will understand that certain features of these embodiments can be combined and other alternatives will readily occur to those skilled in the art. In particular, the described embodiments are not limited to the example dimensions and materials mentioned above.

Moreover, as an alternative, the step of depositing the rear-face protective resin layer 23 described in relation to FIG. 6 can be omitted, the isolation of the rear face of the chips thus being realized solely by the layer 29.

Furthermore, as an alternative, the support film 21 fixed onto the front face of the structure, before the thinning step shown in FIG. 3, can be retained until the step of depositing by ALD the isolating layer 29 (after the formation of the trenches 27). In this case, the step shown in FIG. 6 of fixing the structure on the support film 25 can be omitted.

In addition, as an alternative, the step shown in FIG. 2 of depositing metal connection pillars 19 on the upper face of the metal contact pads 15 of the integrated circuits can be omitted. In this case, the electric connections of each chip to an external device are established directly by the contact pads 15.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
  forming a plurality of trenches through a semiconductor substrate and an interconnection layer, each of the plurality of trenches extending through a first face of the semiconductor substrate and a second face of the semiconductor substrate that is opposite the first face, the interconnection layer being on the second face of the semiconductor substrate, the semiconductor substrate including a plurality of integrated circuits, the plurality of trenches delimiting laterally a plurality of chips each including an integrated circuit of the plurality of integrated circuits, the interconnection layer including at least one metal connection pad for each of the plurality of chips; and
  electrically isolating flanks of each of the plurality of chips by forming an electrically isolating layer on the first face of the semiconductor substrate and lateral walls of the plurality of trenches, the electrically isolating layer disposed on lateral walls of the semiconductor substrate and of the interconnection layer in the plurality of trenches, the electrically isolating layer including at least one oxide layer.

2. The method of claim 1, wherein the forming the electrically isolating layer on the lateral walls of the plurality of trenches includes forming the electrically isolating layer by Atomic Layer Deposition (ALD).

3. The method according to claim 1, wherein, during the forming the plurality of trenches and the electrically isolating the flanks of each of the plurality of chips, the chips are fixed by a support film on the second face of the semiconductor substrate.

4. The method according to claim 3, wherein the trenches extend through the semiconductor substrate to the support film.

5. The method according to claim 1, wherein the trenches are formed by at least one of sawing, etching, or ablation.

6. The method according to claim 1, further comprising depositing a layer of protective resin on the first face of the semiconductor substrate before the forming the plurality of trenches.

7. The method according to claim 1, further comprising exposing the first face by thinning the semiconductor substrate before the forming the plurality of trenches.

8. The method according to claim 1, wherein the electrically isolating layer includes at least one of alumina, silicon dioxide or titanium dioxide.

9. The method of claim 1, wherein the semiconductor substrate has a thickness between 300 μm and 900 μm.

10. The method of claim 1, further comprising:
  forming a protective layer on the first face of the semiconductor substrate, the forming of the plurality of trenches including forming the plurality of trenches through the protective layer, the forming of the electrically isolating layer including forming the electrically isolating layer on the protective layer, the electrically isolating layer disposed on lateral walls of the protective layer in the plurality of trenches.

11. A method, comprising:
  attaching a support film to an interconnection layer, the interconnection layer being on a first side of a semiconductor substrate, the semiconductor substrate having a plurality of integrated circuits at the first side;
  forming a plurality of trenches extending through the semiconductor substrate and the interconnection layer and to the support film, the plurality of trenches laterally delimiting a plurality of chips, each of the plurality of chips including at least one of the plurality of integrated circuits, the interconnection layer including at least one metal connection pad for each of the plurality of chips; and
  forming an electrically isolating layer on a second side of the semiconductor substrate that is opposite to the first side, on lateral surfaces of the semiconductor substrate exposed by the plurality of trenches, on portions of the support film exposed by the plurality of trenches, and on lateral surfaces of the interconnection layer exposed by the plurality of trenches, the electrically isolating layer being a dielectric oxide layer.

12. The method of claim 11, further comprising forming a protective layer on the first side of the semiconductor substrate, the plurality of trenches extending through the protective layer.

13. The method of claim 12, wherein the protective layer includes an epoxy resin.

14. The method of claim 11, further comprising forming a plurality of metal pillars on and in contact with metal pads of the plurality of integrated circuits at the first side of the semiconductor substrate, wherein the support film covers the plurality of metal pillars.

15. The method of claim 11, further comprising removing the support film and portions of the electrically isolating layer on the portions of the support film exposed by the plurality of trenches.

16. The method of claim 11, wherein the forming the electrically isolating layer includes forming the electrically isolating layer by Atomic Layer Deposition (ALD).

17. The method of claim 16, wherein the forming the electrically isolating layer includes forming the electrically isolating layer to have a thickness between 20 nm and 40 nm.

18. The method of claim 11 wherein the electrically isolating layer is a continuous electrically isolating layer on the second side of the semiconductor substrate, on the lateral surfaces of the semiconductor substrate exposed by the plurality of trenches, on the portions of the support film exposed by the plurality of trenches, and on the lateral surfaces of the interconnection layer exposed by the plurality of trenches.

19. A method, comprising:
forming a plurality of metal pillars on metal pads of a plurality of integrated circuits at a first side of a semiconductor substrate;
attaching a first support film to the first side of the semiconductor substrate, the first support film covering the plurality of metal pillars;
thinning a second side of the semiconductor substrate that is opposite the first side;
removing the first support film;
attaching a second support film to the first side of the semiconductor substrate;
forming a plurality of trenches extending through the semiconductor substrate to the second support film, the plurality of trenches laterally delimiting a plurality of chips, each of the chips including at least one of the plurality of integrated circuits; and
depositing an electrically isolating layer on lateral surfaces of the semiconductor substrate exposed by the plurality of trenches.

20. The method of claim 19, further comprising forming a protective layer on the second side of the semiconductor substrate, the plurality of trenches extending through the protective layer.

21. A method, comprising:
forming a plurality of trenches through a semiconductor substrate and an interconnection layer, each of the plurality of trenches extending through a first face of the semiconductor substrate and a second face of the semiconductor substrate that is opposite the first face, the interconnection layer being on the second face of the semiconductor substrate, the semiconductor substrate including a plurality of integrated circuits, the plurality of trenches delimiting laterally a plurality of chips each including an integrated circuit of the plurality of integrated circuits, the interconnection layer including at least one metal connection pad for each of the plurality of chips; and
electrically isolating flanks of each of the plurality of chips by forming an electrically isolating layer on the first face of the semiconductor substrate and lateral walls of the plurality of trenches, the electrically isolating layer disposed on lateral walls of the semiconductor substrate and of the interconnection layer in the plurality of trenches, the electrically isolating layer being formed by Atomic Layer Deposition (ALD).

22. The method according to claim 21, wherein the plurality of chips are fixed by a support film on the second face of the semiconductor substrate.

23. A method, comprising:
forming a plurality of trenches through a semiconductor substrate and an interconnection layer, each of the plurality of trenches extending through a first face of the semiconductor substrate and a second face of the semiconductor substrate that is opposite the first face, the interconnection layer being on the second face of the semiconductor substrate, the semiconductor substrate including a plurality of integrated circuits, the plurality of trenches delimiting laterally a plurality of chips each including an integrated circuit of the plurality of integrated circuits, the interconnection layer including at least one metal connection pad for each of the plurality of chips; and
electrically isolating flanks of each of the plurality of chips by forming an electrically isolating layer on the first face of the semiconductor substrate and lateral walls of the plurality of trenches, the electrically isolating layer disposed on lateral walls of the semiconductor substrate and of the interconnection layer in the plurality of trenches, the electrically isolating layer including at least one of alumina, silicon dioxide, or titanium dioxide.

24. The method according to claim 23, wherein the plurality of chips are fixed by a support film on the second face of the semiconductor substrate.

25. A method, comprising:
forming a protective layer on a first face of a semiconductor substrate;
forming a plurality of trenches through the protective layer, the semiconductor substrate, and an interconnection layer, each of the plurality of trenches extending through the first face of the semiconductor substrate and a second face of the semiconductor substrate that is opposite the first face, the interconnection layer being on the second face of the semiconductor substrate, the semiconductor substrate including a plurality of integrated circuits, the plurality of trenches delimiting laterally a plurality of chips each including an integrated circuit of the plurality of integrated circuits, the interconnection layer including at least one metal connection pad for each of the plurality of chips; and
electrically isolating flanks of each of the plurality of chips by forming an electrically isolating layer on the protective layer, on the first face of the semiconductor substrate, and lateral walls of the plurality of trenches, the electrically isolating layer disposed on lateral walls of the protective layer, of the semiconductor substrate, and of the interconnection layer in the plurality of trenches.

26. The method according to claim 25, wherein the plurality of chips are fixed by a support film on the second face of the semiconductor substrate.

* * * * *